United States Patent [19]
Glass et al.

[11] 4,189,521
[45] Feb. 19, 1980

[54] EPITAXIAL GROWTH OF M-TYPE HEXAGONAL FERRITE FILMS ON SPINEL SUBSTRATES AND COMPOSITE

[75] Inventors: Howard L. Glass, Orange; Frederick S. Stearns, Placentia; David M. Heinz, Orange, all of Calif.

[73] Assignee: Rockwell International Corporation, El Segundo, Calif.

[21] Appl. No.: 812,862

[22] Filed: Jul. 5, 1977

[51] Int. Cl.$^2$ ............................................. C04B 35/00
[52] U.S. Cl. .......................... 428/539; 423/DIG. 12; 156/624; 252/62.56; 350/96.34; 423/594
[58] Field of Search ............... 428/469, 471, 472, 539; 23/DIG. 1; 156/622, 624, DIG. 74, 77, 78; 252/62.56, 62.62, 62.63; 423/594; 333/24.1, 24.2; 350/96 M, 96 WG

[56] References Cited
U.S. PATENT DOCUMENTS

| 3,150,925 | 9/1964 | Gambino | 156/624 |
| 3,332,796 | 7/1967 | Kooy | 156/624 X |
| 3,486,937 | 12/1969 | Linares | 156/624 |
| 3,498,836 | 3/1970 | Gambino | 156/624 |
| 3,897,355 | 7/1975 | Arendt et al. | 252/62.63 |
| 4,057,458 | 11/1977 | Maeda et al. | 156/624 |

OTHER PUBLICATIONS

"Handbook of Microwave Ferrite Materials", by Aulock, Whippany, N.J., Academic Press, 1965, pp. 461, 485.
"Liquid Phase Epitaxy of Hexagonal Ferrites", by Stearns and Glass, Material Research Bulletin, vol. 10, pp. 1255-1258, 1975.
"Liquid Phase Epitaxy of Hexagonal Ferrites and Spinel Ferrites on Non-Magnetic Spinel Substrates", by Stearns & Glass, vol. 11, pp. 1319-1326, 10/1976, Materials Research Bulletin.
"Advanced Epitaxial Ferrite Devices", Pro. No. IT 161102BH57-03, Final Report, U.S. Army Research Office, Contract #DAAG29-76E-0017, 1/19/1977.

Primary Examiner—John E. Kittle
Attorney, Agent, or Firm—H. Frederick Hamann; G. Donald Weber, Jr.

[57] ABSTRACT

M-type hexagonal ferrites whose prototype chemical formula (BaFe$_{12}$O$_{19}$) contains no zinc and W-type hexagonal ferrites whose prototype chemical formula is (BaZn$_2$Fe$_{16}$O$_{27}$) can be successfully grown by LPE on spinel substrates having appropriate lattice parameters when controlled quantities of the zinc are present in the melts from which these hexagonal ferrites are grown. Using this growth technique, composites comprising a monocrystalline magnetic M-type or W-type hexagonal ferrite film on a non-magnetic single crystalline spinel substrate are provided.

11 Claims, 6 Drawing Figures

EPITAXIAL GROWTH OF M-TYPE HEXAGONAL FERRITE FILMS ON SPINEL SUBSTRATES AND COMPOSITE

BACKGROUND OF THE INVENTION

1. Field of the Invention

The invention relates to the field of epitaxial growth of hexagonal ferrites on spinel substrates.

2. Prior Art

Liquid phase epitaxial growth has become well established as a general technique for growing thin films of desired materials on monocrystalline substrates. The melt composition generally comprises a flux such as barium oxide/boron oxide or lead oxide/boron oxide. To this flux are added source compounds which contain the component ions of the film to be grown. The source compounds are usually oxides or compounds which will decompose to oxides at the high temperature to which the melt is heated in order to form a uniform melt prior to film growth. The source compounds are usually included in the melt in quantities which provide a stoichiometric quantity of each of the ions present in the film to be grown. The flux and source materials are usually mixed as powders and heated to a high enough temperature that they melt and may be stirred to form a homogeneous melt. The melt is then cooled to below its saturation temperature with respect to the deposition of the desired film material. A substrate on which it is desired to deposit the film is lowered into the melt for a period of time sufficient to grow the desired film to the desired thickness.

Composites of M-type or W-type hexagonal ferrite thin films on nonmagnetic substrates would be useful because of the microwave properties of these hexagonal ferrites. Unfortunately, prior art attempts to grow such films by liquid phase epitaxy on non-magnetic substrates have proved unsuccessful.

A method is needed which will successfully grow M-type and W-type hexagonal ferrites on non-magnetic substrates.

SUMMARY OF THE INVENTION

Monocrystalline M-type or W-type hexagonal ferrite films are grown on non-magnetic spinel substrates by incorporating a controlled, non-zero, quantity of zinc ions in the melt. The zinc so incorporated in the melt comprises a relatively small percentage of the W-type film and does not deposit as a significant constituent of the M-type film. In an M-type film grown under these condition, zinc is present only in minute quantities, if at all. For both M-type and W-type films, the ratio of zinc to iron in the film is much smaller than the ratio of zinc to iron in the melt. Utilizing the method of this invention, composites comprising M-type or W-type hexagonal ferrites epitaxially disposed on non-magnetic spinels are successfully produced. These composites have excellent microwave characteristics as well as beneficial optical characteristics.

PREFERRED EMBODIMENT

Figure 1:
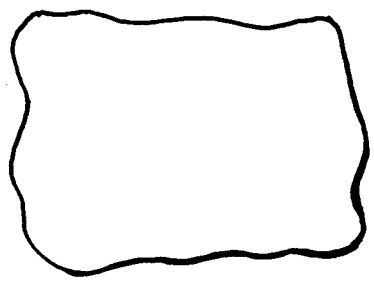
FIGS. 1–6 illustrate the changing character of the M-type hexagonal ferrite deposit as the quantity of zinc in the melt is increased.
Figure 2:
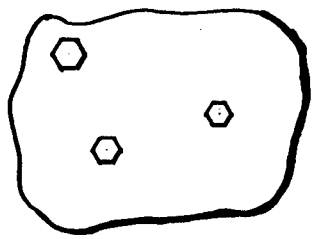
Figure 3:
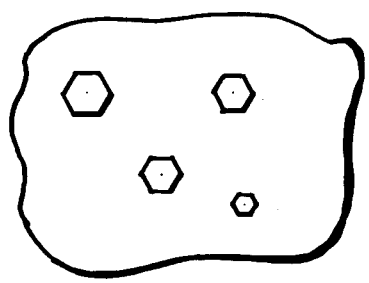

A liquid phase epitaxial melt composition expected to yield stoichiometric M-type hexagonal ferrite films of $BaFe_{12}O_{19}$ is formed from the following molar quantities of powdered source materials $BaCO_3 = 3.5812$ mole; $B_2O_3 = 2.0461$ mole and $Fe_2O_3 = 0.9923$ mole. These source materials are slowly heated to approximately 1200° C. and held at that temperature for about one hour. During this heating, the $BaCO_3$ decomposes to form BaO. The melt is then cooled to about 950° C. and held at that temperature for about 19 hours to obtain a uniform melt. After a uniform melt is obtained, the melt is cooled to growth temperatures. M-type hexagonal ferrite deposits on substrates of monocrystalline hexagonal ferrite, if they are introduced into this melt for an appropriate period of time during which the temperature of the melt is below the saturation temperature of the melt. However, when a spinel type substrate is introduced into this melt, no M-type hexagonal ferrite is deposited on the substrate.

We have found that the inclusion of zinc oxide in the above melt in a quantity between 0.1322 and 0.4086 moles (zinc oxide to iron oxide ratios of 0.1332 to 0.4118) results in nucleation and epitaxial growth of M-type hexagonal ferrites on the same spinel substrates on which growth does not occur in the absence of the zinc. At the highest concentration of zinc oxide, in this range, the epitaxial growth consists of a mixture of M-type and W-type hexagonal ferrites on both spinel and hexagonal ferrite substrates. For zinc oxide $\leq 0.2060$ mole (zinc oxide to iron oxide ratio $\leq 0.2076$) only M-type hexagonal ferrites are deposited. For zinc oxide $= 0.2758$ mole (ratio 0.2780) only M-Type hexagonal ferrite films deposited on hexagonal ferrite substrate ; growth on spinel was not attempted.

M-type hexagonal ferrite is not capable of containing significant portions of zinc, consequently, despite the presence of significant zinc in the melt, zinc is not present in the M-type hexagonal ferrite film in significant quantities. In particular, the zinc concentration in the film has been shown by x-ray spectrascopy in scanning electron microscope to be less than 1 percent of the iron concentration. Thus, the zinc functions as an activator or catalyst for the deposition of the monocrystalline M-type hexagonal ferrite film on the spinel substrate rather than as a stoichiometric constituent of that film. Higher quantities of zinc result in the growth of W-type films.

The zinc apparently controls the growth of M-type hexagonal ferrites on spinel substrates either by lowering the quantity of energy necessary for the nucleation of the M-type hexagonal ferrites on the spinel surface or by raising the energy necessary for spontaneous nucleation of M-type hexagonal ferrites in the melt. Either of these effects would explain the ability of the melt to epitaxially deposit M-type hexagonal ferrites on spinel substrates when the quantity of zinc present is in the above range. However, as is illustrated schematically in FIGS. 1–6, where the substrate is in contact with the melt for a set time, the number of M-type hexagonal ferrite nucleation sites on the spinel substrate and the size of the resulting M-type hexagonal ferrite crystals increases with increasing zinc concentration in the melt. This indicates that the effect of the zinc is to lower the nucleation energy of the M-type hexagonal ferrites on the spinel substrate, rather than solely to increase the spontaneous nucleation energy of the M-type hexagonal ferrite in the melt.

The control effect of the zinc presence in the melt is illustrated by the following examples. Monocrystalline substrates of M-type hexagonal ferrites and spinels selected from $MgIn_xGa_{2-x}O_4$, $0.19 \leq x \leq 0.38$ and $ZnGa_2O_4$ were utilized successfully.

EXAMPLE I

A fluxed melt composition for liquid phase epitaxy was formulated using 3.5812 moles of $BaCO_3$, 2.0461 moles of $B_2O_3$ and 0.9923 moles of $Fe_2O_3$ all in powder form. This melt had a $ZnO/Fe_2O_3$ ratio of zero. This melt composition was heated until the $BaCO_3$ had decomposed to BaO. The temperature was then maintained at 930° C. until a uniform homogeneous melt was obtained. This melt was then cooled and determined to have a saturation temperature of approximately 890° C. The melt was then heated to a temperature of 900° C. A monocrystalline M-type hexagonal ferrite crystal of the composition $BaFe_{12}O_{19}$ was lowered into this melt and the temperature was immediately reset to 885° C., for an undercooling of 5° C. The crystal was rotated at 26 rpm for 18.55 hours. A continuous epitaxial M-type hexagonal ferrite film of $BaFe_{12}O_{19}$ grew on the substrate.

A spinel substrate of $MgIn_{0.19}GA_{1.81}O_4$ was lowered into this melt and rotated at 26 rpm for 6.50 hours. No deposit formed on this substrate.

EXAMPLE II 0.0322 moles of zinc oxide were then added to the melt composition of Example I, thereby yielding a $ZnO/Fe_2O_3$ ratio of 0.0325 in the melt. The melt was reheated to a temperature of about 1030° C. for about 17 hours until the new melt was homogeneous. The melt was then cooled and its saturation temperature was determined to be approximately 900° C. The melt was then cooled to a temperature of 890° C. to yield 10° C. of undercooling. An M-type hexagonal ferrite substrate of $BaFe_{12}O_{19}$ was lowered into this melt for 16.08 hours while being rotated at 26 rpm. A continuous epitaxial M-type hexagonal ferrite film deposited on this substrate. A spinal substrate ($MgIn_{0.19}Ga_{1.81}O_4$) was then lowered into the melt at 887° C. and rotated at 26 rpm for 3.77 hours. No deposit formed on this substrate. The temperature of the melt was then lowered to 880° C. and the spinel substrate was lowered into the melt and rotated at 28 rpm for 3.73 hours. No growth was obtained.

EXAMPLE III 0.0399 moles of zinc oxide, were added to the melt from Example II. This new melt contained a total of 0.0721 moles of zinc oxide for a $ZnO/Fe_2O_3$ ratio of 0.0727. This new melt was heated to about 980° C. for about 18 hours to form a homogeneous melt. Upon cooling, the melt was determined to have a saturation temperature of approximately 905° C. A monocrystalline M-type hexagonal ferrite substrate of $BaFe_{12}O_{19}$ was lowered into this new melt while the melt temperature was 905° C. The temperature was immediately reset to 895° C. for an undercooling of 10° C. The crystal was rotated at a rate of 26 rpm for a period of 2.38 hours. A continuous M-type hexagonal ferrite film of $BaFe_{12}O_{19}$ deposited on this substrate. A monocrystalline spinel substrate of $MgIn_{0.38}Ga_{1.62}O_4$ was lowered into this melt at a temperature of 905° C. The temperature was immediately reset to 890° C. The crystal was rotated at a rate of 26 rpm for 3.63 hours. No deposit formed on this substrate.

EXAMPLE IV 0.0601 moles of zinc oxide were added to the melt from Example III. This new melt contained a total of 0.1322 moles of zinc oxide and had a zinc oxide to iron oxide ratio of 0.1332. This new melt was heated to about 980° C. for about 17.5 hours to form a homogeneous melt. This melt was then cooled and determined to have a saturation temperature of approximately 910° C. A monocrystalline M-type hexagonal ferrite substrate of $BaFe_{12}O_{19}$ was lowered into this 910° C. melt. The temperature was then immediately reset to 900° C. for an undercooling of 10° C. The crystal was rotated at a rate of 26 rpm for a period of 4.45 hours. An epitaxial M-type hexagonal ferrite film of $BaFe_{12}O_{19}$ deposited on this substrate. The melt was then reheated to 910° C. A monocrystalline spinel substrate of $MgIn_{0.38}Ga_{1.62}O_4$ was lowered into this melt and the temperature was immediately reset to 900° C. The crystal was rotated at a rate of 26 rpm for 5.78 hours. A spotty deposit which resembled hexagonal ferrite formed on this substrate. The morphology of this deposit was indistinct. Similar results were obtained for a substrate of $Mg_{In0.19}Ga_{1.81}O_4$ grown under similar conditions and for another substrate of $MgIn_{0.38}Ga_{1.62}O_4$ grown at 890° C.

EXAMPLE V 0.0492 of moles of zinc oxide were added to the melt from Example IV. This gave a total of 0.1814 moles of zinc oxide in the melt for a zinc oxide to iron oxide ratio of 0.1828. This new melt was heated to about 980° C. for about 20 hours to form a homogeneous melt. The melt was then cooled and determined to have a saturation temperature of approximately 930° C. The melt was then heated to 940° C. A monocrystalline M-type hexagonal ferrite substrate of $BeFe_{12}O_{19}$ was lowered into this melt and the temperature was immediately reset to 920° C. for an undercooling of 10° C. The crystal was rotated at a rate of 26 rpm for a period of 16.5 hours. An epitaxial M-type hexagonal ferrite film of $BaFe_{12}O_{19}$ deposited on this substrate. A monocrystal line spinel substrate of $MgIn_{0.38}Ga_{1.62}O_4$ was lowered into this melt at a temperature of 940° C. The temperature was immediately reset to 920° C. and the crystal was rotated at 28 rpm for 5.00 hours. Individual M-type hexagonal ferrite crystals epitaxially deposited on this substrate. The individual crystals have distinct hexagonal morphologies and are a few hundred microns across.

EXAMPLE VI 0.0246 moles of zinc oxide were added to the melt from Example V. This gave a total of 0.2060 moles of zinc oxide in the melt for a zinc oxide to iron oxide ratio of 0.2076. After heating to form a homogeneous melt this new melt was determined to have a saturation temperature of approximately 935° C. A monocrystalline M-type hexagonal ferrite substrate of $BaFe_{12}O_{19}$ was lowered into this new melt at a temperature of 935° C. The temperature was immediately reset to 920° C. providing an undercooling of about 15° C. The crystal was rotated at a rate of 28 rpm for a period of 16.17 hours. An epitaxial M-type hexagonal ferrite film deposited on this substrate. A monocrystalline spinel substrate of $MgIn_{0.38}Ga_{1.62}O_4$ was lowered into this melt at a temperature of 915° C. and at a rotation rate of 28 rpm for 3.11 hours. Many epitaxial M-type hexagonal ferrite crystals grew on this substrate.

A monocrystalline spinel substrate of $ZnGa_2O_4$ was lowered into this melt at a temperature of 915° C. at a rotation rate of 28 rpm for a period of 0.97 hours. Many epitaxial M-type hexagonal ferrite crystals grew on this substrate.

EXAMPLE VII 0.0698 moles of zinc oxide were added to the melt from Example VI. This gave a total of 0.2758 moles of zinc oxide in the melt for a zinc oxide to iron oxide ratio of 0.2780. After a homogeneous melt was formed, an M-type hexagonal ferrite substrate was lowered into the melt at a temperature of 922° C. at a rotation rate of 28 rpm for a period of 2.95 hours. M-type hexagonal ferrite grew epitaxially on this substrate. Because of a shortage of spinel substrates, no attempt was made to grow a film on a spinel substrate using this melt.

EXAMPLE VIII 0.0686 moles of zinc oxide were added to the melt from Example VII. This gave a total of 0.3444 moles of zinc oxide in the melt for a zinc to iron ratio of 0.3471. After a uniform melt had been formed, a monocrystalline M-type hexagonal substrate was lowered into this melt at a temperature of 925° C. at a rotation rate of 28 rpm for a period of 3.33 hours. Epitaxial M-type hexagonal ferrite grew on this M-type hexagonal ferrite substrate. Because of a shortage of spinel substrates, no attempt was made to grow a film from this melt on a spinel substrate.

EXAMPLE IX 0.0641 moles of zinc oxide were added to the melt from Example VIII. This gave a total of 0.4085 moles of zinc oxide in the melt for a zinc oxide to iron oxide ratio of 0.4118. After a uniform melt was obtained, an M-type hexagonal ferrite was lowered into the melt at a temperature of 930° C at a rotation rate of 28 rpm for a period of 1.98 hours. A combination of M-type and W-type ($BaZn_2Fe_{16}O_{27}$) hexagonal ferrites grew on this substrate. A monocrystalline spinel substrate of $MgIn_{0.38}Ga_{1.62}O_4$ was lowered into this melt at a temperature of 930° C. at a rotation rate of 28 rpm for a period of 4.7 hours. A combination of W-type and M-type ferrites grew on this substrate. Thereafter, a second substrate of the same composition was lowered into the melt under the same growth conditions for a period of 1.38 hours. Once again, a combination of W-type and M-type ferrites grew on the substrate. A substrate of $ZnGa_2O_4$ was then lowered into the melt at a temperature of 930° C. and rotated at 28 rpm for a period of 1.52 hours. A combination of W-type and M-type ferrites grew on this substrate.

EXAMPLE X 0.0609 moles of zinc oxide were added to the melt from Example IX. This gave a total of 0.4694 moles of zinc oxide in the melt for a zinc oxide to iron oxide ratio of 0.4630. After a uniform melt was obtained, a monocrystalline M-type hexagonal ferrite substrate was lowered into the melt at 940° C. at a rotation rate of 28 rpm for a period of 3.55 hours. W-type hexagonal ferrite grew on this substrate. There may also have been some growth of M-type hexagonal ferrite, however the test equipment utilized to determine film composition was not capable of accurately determining the source of a diffraction pattern with respect to the question of whether it comes from the film or the underlying substrate in the cases of thin films such as these. Consequently, it is not certain whether the film contained only W-type or a combination of W-type and M-type hexagonal ferrites. Thereafter, a wafer of $MgIn_{0.38}Ga_{1.62}O_4$ was lowered into the melt at 940° C. at a rotation rate of 28 rpm for a period of one hour. W-type hexagonal ferrite grew on this substrate. A substrate of $MgIn_{0.19}Ga_{1.81}O_4$ was lowered into this melt at a temperature of 940° C. at a rotation rate of 28 rpm for a period of 1.62 hours. W-type hexagonal ferrite material grew on this substrate. A wafer of $ZnGa_2O_4$ was lowered into this melt at 940° C. at a rotation rate of 28 rpm for a period of two hours. A spinel ferrite formed on this substrate. The composition of this ferrite is thought to be $ZnFe_2O_4$.

All spinel substrates had the (111) crystalographic plane as the growth surface. In each of the instances in which the crystallographic orientation of the M-type hexagonal ferrite was determined, the basal plane of the hexagonal ferrite was parallel to the (111) plane of the spinel and the hexagonal a-axis of the ferrite was parallel to [10$\bar{1}$] of the spinel.

All spinel substrates developed rough surfaces due to etching by the melt. This held true whether the substrate was inserted in the melt at a higher temperature than the growth temperature or at the growth temperature. In some instances, the etching of the surface of the substrate resulted in the growth of upright epitaxial M-type hexagonal platelets all of which were aligned along preferred directions ($\bar{1}$11), (1$\bar{1}$1) or (11$\bar{1}$) of the substrate crystal lattice.

FIGS. 1 through 6 illustrate the appearance of a spinel substrate following a growth run during which it is immersed in the liquid phase epitaxial melt of an Example. In FIG. 1, an insufficient quantity of zinc was present in the melt to induce growth of a hexagonal ferrite on the spinel substrate. The greater the figure number, the greater the zinc concentration in the melt or the growth time with a corresponding increase in the number and size of epitaxial hexagonal ferrite crystallites formed on the surface of the substrate. As illustrated, a number of separate distinct crystallites may be formed, or growth may be allowed to continue until various crystallites grow together to form single larger crystallites.

For microwave devices, individual discs or platelets of the magnetic material are needed. These platelets or discs must be very thin for optimal microwave operation of many devices. Consequently, for mounting, handling and other purposes, an epitaxial composite of the microwave material on a non-magnetic material is ideal. If a continuous film of the microwave material is formed on the substrate by liquid phase epitaxy, then the film must be etched or defined in some other manner in order to form isolated discs or platelets of the magnetic material. M-type hexagonal ferrite is difficult to etch. Consequently, it has been found that the termination of the epitaxial growth when appropriate size individual platelets have been formed on the substrate is a very useful method of eliminating the need for selective etching or other definition of platelet configuration. Just such selective growth is facilitated by incorporation of appropriate quantities of zinc in the melt from which the M-type hexagonal ferrite is grown. Thus, the presently described inventive method is a very useful method for forming platelets of M-type hexagonal ferrite on non-magnetic substrates for microwave use.

Figure 4:
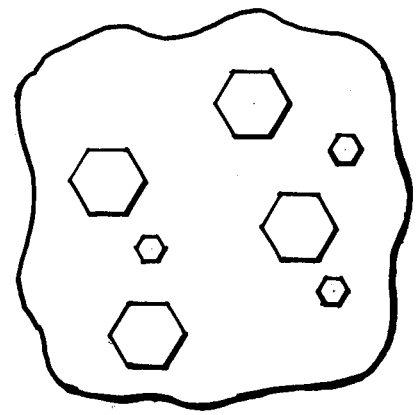
Figure 5:
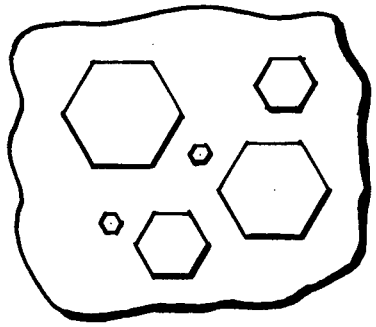
Figure 6:
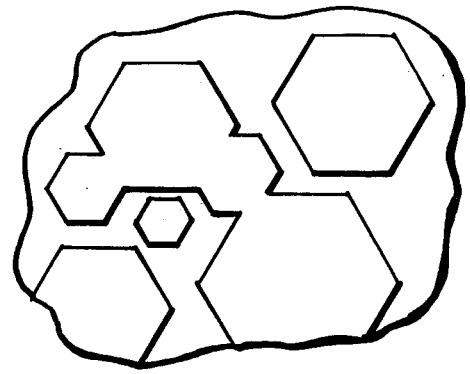

In the microwave field the isolated epitaxial crystallites as illustrated in FIGS. 4 and 5 will often be preferable to a continuous uniform film because they eliminate the necessity of selective etching of the M-type hexagonal ferrite which can be difficult.

It should be recognized, that the important characteristic of the invention, with respect to the successful growth of the M-type hexagonal ferrite on the spinel substrate, is that there be sufficient zinc at the substrate surface to induce nucleation of M-type hexagonal ferrite crystals. Consequently, where a zinc containing substrate is utilized lesser quantities of zinc may be incorporated in the melt if the zinc content of the substrate provides an effective quantity of zinc at the substrate surface.

The exact mechanism by which the zinc concentration in the melt controls the successful growth of monocrystalline M-type hexagonal ferrite on spinel substrates is not known. However, it appears to be in the nature of, or analogous to, an activator or catalyst. At most, minute quantities of the zinc are incorporated in the deposited M-type film as compared to the zinc concentration in the melt. That is, a melt having a zinc oxide to iron oxide ratio of ~20%, results in the growth of an M-type hexagonal ferrite which has a zinc to iron ratio which is believed to be substantially less than 1%. This ratio (Zn/Fe Film)/(Zn/Fe Melt) demonstrates that the effectiveness of the zinc in inducing epitaxial growth of the film is not in the nature of stoichiometric component of the film, but is more in the nature of an activator or catalyst.

A preferred embodiment of the invention has been described. Those skilled in the art will be able to vary the details of that embodiment without departing from the scope of the invention. Since the examples are illustrative rather than limitative, the protection afforded the invention is limited only by the appended claims.

What is claimed is:

1. A composite comprising:
   a monocrystalline nonmagnetic spinel substrate having a lattice constant in the range from 8.309Å to 8.381Å, and
   a film of hexagonal ferrite selected from the group consisting of M-type and W-type epitaxially disposed on said substrate.

2. The composite recited in claim 1 wherein said substrate is selected from the group consisting of $MgIn_xGa_{2-x}O_4$, $0.19 \leq X \leq 0.38$ and $ZnGa_2O_4$.

3. The composite recited in claim 2 wherein said film is M-type.

4. The composite recited in claim 1 wherein said film is W-type and said substrate is selected from the group consisting of $MgIn_xGa_{2-x}O_4$, $0.19 \leq X \leq 0.38$.

5. A method of epitaxially depositing an hexagonal ferrite film on a non-magnetic spinel substrate by liquid phase epitaxy said method comprising:
   forming a fluxed melt containing quantities of barium, iron and oxygen suitable for epitaxially growing said film;
   including in said melt a quantity of zinc which provides a zinc oxide to iron oxide ratio in the range between 0.1332 and 0.4630 moles of zinc oxide per mole of iron oxide;
   contacting said melt with a spinel-type substrate having a lattice constant in the range from 8.309Å to 8.381Å and holding said melt at a temperature below its saturation temperature for a period of time sufficient to grow a desired thickness of said hexagonal ferrite on said substrate.

6. The method recited in claim 5 wherein said substrate is selected from the group consisting of $MgIn_xGa_{2-x}O_4$, $0.19 \leq X \leq 0.38$ and $ZnGa_2O_4$.

7. The method recited in claim 5 wherein the growth of said film is terminated while the film comprises a plurality of isolated M-type hexagonal ferrite islands epitaxially disposed on said substrate.

8. The composite recited in claim 1 wherein said film disposed on said substrate is discontinuous.

9. The composite recited in claim 1 wherein said film is disposed on the (111) crystallographic plane of said spinel substrate.

10. The method recited in claim 5 wherein said film is M-type hexagonal ferrite when said ratio is between 0.1332 and 0.4118 moles.

11. The method recited in claim 5 wherein said film is W-type hexagonal ferrite when said ratio is between 0.4118 and 0.4630.

* * * * *